US008520180B2

United States Patent
Tsai et al.

(10) Patent No.: US 8,520,180 B2
(45) Date of Patent: Aug. 27, 2013

(54) DISPLAY DEVICE HAVING TRANSPARENT LAYER PARTIALLY COVERED WITH SEALANT AND METHOD FOR FABRICATING SAME

(75) Inventors: Yuan-Chih Tsai, Hsinchu (TW); Ted-Hong Shinn, Hsinchu (TW); Yi-Ching Wang, Hsinchu (TW)

(73) Assignee: E Ink Holdings Inc., Hsinchu County (TW)

( * ) Notice: Subject to any disclaimer, the term of this patent is extended or adjusted under 35 U.S.C. 154(b) by 796 days.

(21) Appl. No.: 12/422,142

(22) Filed: Apr. 10, 2009

(65) Prior Publication Data

US 2010/0208188 A1 Aug. 19, 2010

(30) Foreign Application Priority Data

Feb. 19, 2009 (TW) ................................ 98105339 A

(51) Int. Cl.
*G02F 1/1339* (2006.01)
*H01J 9/20* (2006.01)
*H01L 27/12* (2006.01)

(52) U.S. Cl.
USPC ........................................... 349/153; 359/296

(58) Field of Classification Search
USPC ......... 349/123, 152–160; 174/254; 359/296; 445/25; 216/24
See application file for complete search history.

(56) References Cited

U.S. PATENT DOCUMENTS

| | | | | |
|---|---|---|---|---|
| 5,936,694 A * | 8/1999 | Suzuki et al. | ................. | 349/151 |
| 6,057,900 A * | 5/2000 | Ono et al. | ..................... | 349/110 |
| 6,963,381 B2 * | 11/2005 | Kano et al. | ..................... | 349/113 |
| 8,199,272 B2 * | 6/2012 | Wang et al. | ..................... | 349/53 |
| 2004/0017528 A1 * | 1/2004 | Kano et al. | ..................... | 349/113 |
| 2005/0024339 A1 * | 2/2005 | Yamazaki et al. | ............ | 345/169 |
| 2005/0151899 A1 * | 7/2005 | Chou et al. | ..................... | 349/110 |
| 2007/0146598 A1 * | 6/2007 | Yokokawa et al. | ........... | 349/123 |
| 2008/0239460 A1 * | 10/2008 | Shimizu et al. | ............... | 359/296 |
| 2010/0208188 A1 * | 8/2010 | Tsai et al. | ..................... | 349/153 |
| 2011/0255041 A1 * | 10/2011 | Inoue | ............................ | 349/123 |

(Continued)

FOREIGN PATENT DOCUMENTS

CN 1757052 A 4/2006
CN 1991537 A 7/2007

(Continued)

OTHER PUBLICATIONS

China Official Action (CN101840122B) issued on Dec. 5, 2012.
Taiwan Official Action issued on Dec. 10, 2012.

*Primary Examiner* — Akm Enayet Ullah
(74) *Attorney, Agent, or Firm* — Chun-Ming Shih

(57) ABSTRACT

A display device includes an array substrate, a display medium layer, a transparent layer and a sealant. The array substrate has a first region and a second region surrounding the first region. The display medium layer is disposed on the array substrate and located in the first region. The transparent layer with an upper surface is disposed on the display medium layer. The upper surface has a display region and a predetermined sealing region surrounding the display region. The sealant is formed on the array substrate and located in the second region. Also, the sealant surrounds the transparent layer and the display medium layer and covers the predetermined sealing region of the transparent layer. In addition, a method for fabricating the display device is also provided. Since the sealant surrounds the transparent layer and the display medium layer and covers the predetermined sealing region of the transparent layer, the packaging performance of the above display device may be improved.

19 Claims, 7 Drawing Sheets

(56) References Cited

U.S. PATENT DOCUMENTS

2012/0013594 A1* 1/2012 Ishihara et al. ............... 345/211
2013/0001546 A1* 1/2013 Kamada et al. ................ 257/43
2013/0003830 A1* 1/2013 Misra et al. ............. 375/240.12

FOREIGN PATENT DOCUMENTS

| CN | 101276121 A | 10/2008 |
|---|---|---|
| TW | 393405 B | 6/2000 |
| TW | 200734988 A | 9/2007 |

* cited by examiner

DISPLAY DEVICE HAVING TRANSPARENT LAYER PARTIALLY COVERED WITH SEALANT AND METHOD FOR FABRICATING SAME

BACKGROUND

This application claims priority to a Taiwan application No. 098105339 filed Feb. 19, 2009.

FIELD OF THE INVENTION

The invention relates to a display device and method for fabricating the same, and more particular to a display device with high packaging reliability and method for fabricating the same.

DESCRIPTION OF THE RELATED ART

With progress of science and technology, display devices are used in any electric products popularly. Moreover, since the development trend of the portable electrical product is to achieve light weight and thin thickness, the flexible display device are researched.

FIG. 1 is a schematic cross-sectional view of the conventional flexible display device. Referring to FIG. 1, the display device 10 comprises a flexible array substrate 11, a display medium layer 12, a transparent layer 13, a sealant 14, a driver IC 15 and a flexible circuit board 16. The flexible array substrate 11 comprises a substrate 112 and a thin film transistors array 114 disposed thereon. The display medium layer 12, the driver IC 15 and the flexible circuit board 16 are disposed on the flexible array substrate 11. The driver IC 15 is electrically connected to the thin film transistors array 114 and the external circuit (not shown) through the flexible circuit board 16. The transparent layer 13 is disposed on the display medium layer 12. The sealant 14 is formed on the flexible array substrate 11 and surrounding the display medium layer 12 and the transparent layer 13 for preventing the display device 10 from being damaged by the permeated air or mist from outside.

However, the sealant 14 may be slit as the display device 10 is bent several times. Thus, the air or mist from outside may permeate into the display device 10 and damage it. Therefore, it is one of the important issues for the people skilled in this art that how to enhance the combination strength between the sealant and the other elements of the display device for increasing the packaging reliability of the display device.

BRIEF SUMMARY

The invention is directed to a display device with high packaging reliability.

The invention is also directed to a method for fabricating display device to fabricate a display device with high packaging reliability.

The invention provides a display device comprising an array substrate, a display medium layer, a transparent layer and a sealant. The array substrate has a first region and a second region surrounding the first region. The display medium layer is disposed on the array substrate and located in the first region. The transparent layer with an upper surface is disposed on the display medium layer. The upper surface has a display region and a predetermined sealing region surrounding the display region. The sealant is formed on the array substrate and located in the second region. Also, the sealant surrounds the transparent layer and the display medium layer and covers the predetermined sealing region of the transparent layer.

The invention also provides a method for fabricating display device. First, an array substrate with a first region and a second region surrounding the first region is provided. Next, a display medium layer and a transparent layer are formed in sequence in the first region of the array substrate. The transparent layer has an upper surface with a display region and a predetermined sealing region surrounding the display region. Then, a sealant is formed in the second region of the array substrate to surround the transparent layer and the display medium layer and cover the predetermined sealing region of the transparent layer.

For the display device of the invention, the sealant not only surrounds the display medium layer and the transparent layer, also covers the predetermined sealing region of the transparent layer. Thus, the contact area between the sealant and the transparent layer may be increased and the combination strength between the sealant and other elements may be enhanced. Therefore, it can prevent the sealant from slitting as the display device is bent several times. Hence, the invention may effectively increase the packaging reliability of the display device.

In order to make the aforementioned and other objects, features and advantages of the invention comprehensible, preferred embodiments accompanied with figures are described in detail below.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1:
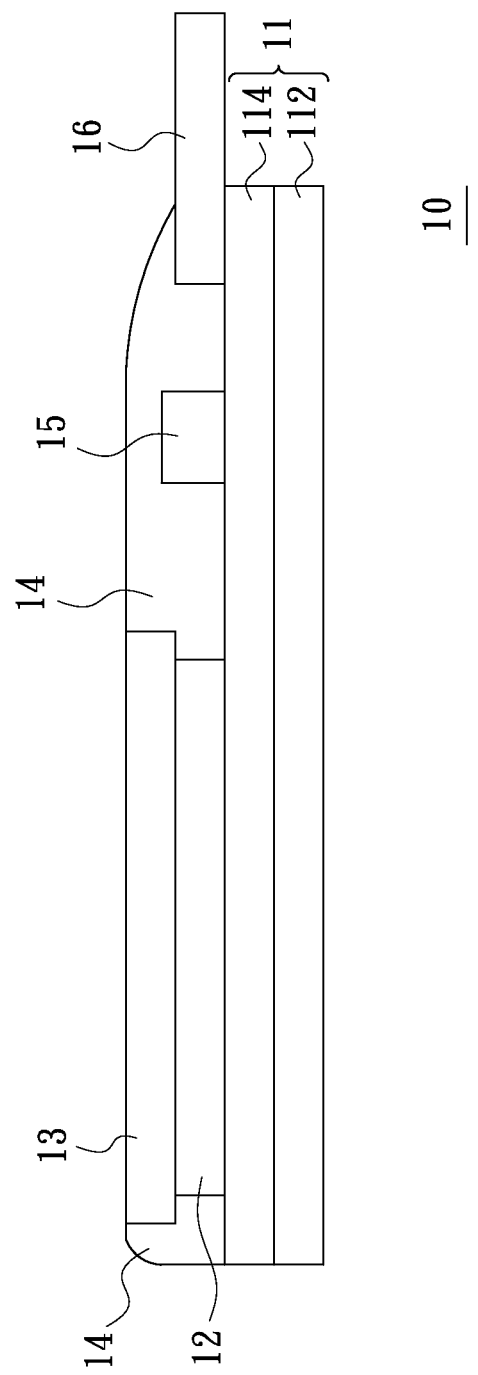
FIG. 1 is a schematic cross-sectional view of the conventional flexible display device.
Figure 2A:
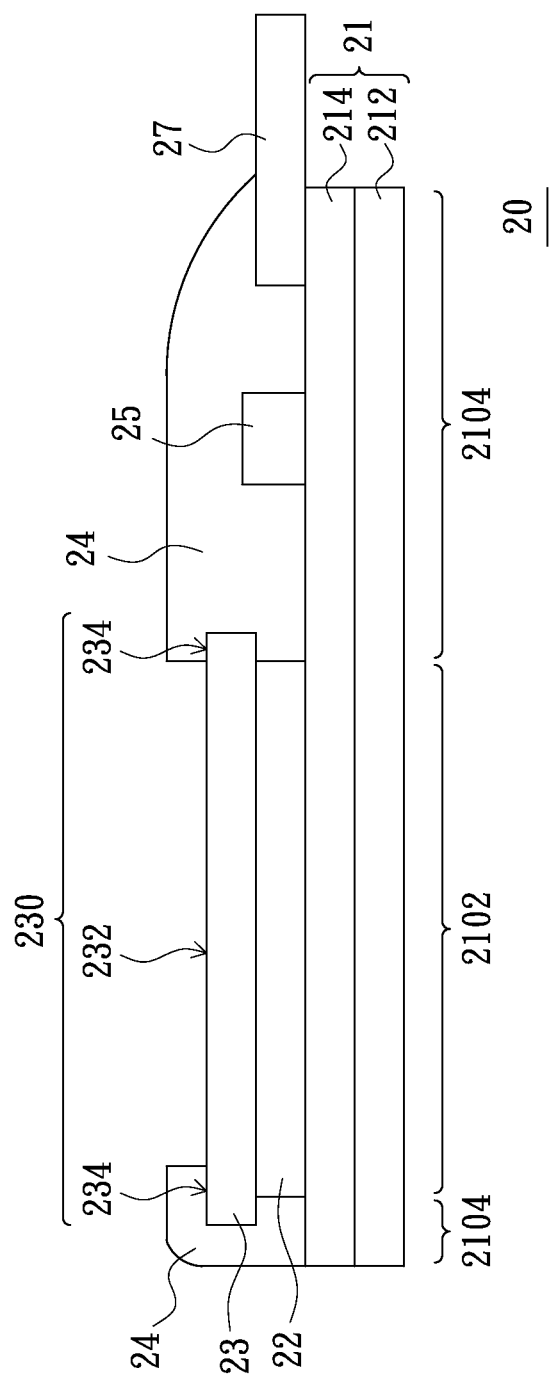
FIG. 2A is a schematic cross-sectional view of the display device according to an embodiment of the invention.

FIG. 2A is a schematic cross-sectional view of the display device according to an embodiment of the invention. Referring to FIG. 2A, the display device 20 comprises an array substrate 21, a display medium layer 22, a transparent layer 23 and a sealant 24. The array substrate 21 has a first region 2102 and a second region 2104 surrounding the first region 2102. In detail, the array substrate 21 comprises a substrate 212 and a switch elements array 214 disposed thereon. The substrate 212 may be a flexible substrate. That is, the display device 20 may be a flexible display device. The switch elements array 214 may be an active elements array or a passive elements array. In this embodiment, the switch elements array 214 may be a thin film transistors array.

Figure 2B:
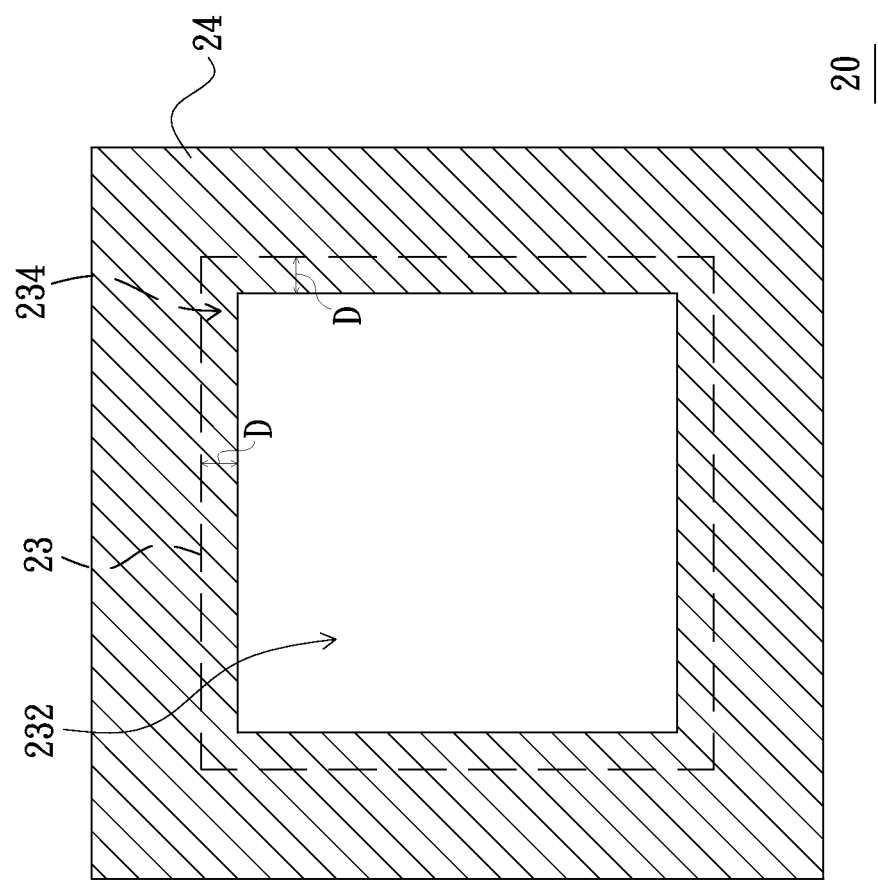
FIG. 2B is a schematic front view of the display device according to an embodiment of the invention.

The display medium layer 22 is disposed on the array substrate 21 and located in the first region 2102. The transparent layer 23 is disposed on the display medium layer 22 and has an upper surface 230 with a display region 232 and a predetermined sealing region 234 surrounding the display region 232, as shown in FIG. 2B. Specifically, the display medium layer 22 may be a liquid crystal layer, an electro-phoretic layer, an electro-wetting layer or an organic electro-luminescence layer. Furthermore, if the display medium layer 22 is a liquid crystal layer, the transparent layer 23 disposed thereon is a polarizer. Alternately, if the display medium layer 22 is an electro-phoretic layer, an electro-wetting layer or an organic electro-luminescence layer, the transparent layer 23 may be a protective layer.

The sealant 24 is formed on the array substrate 21 and located in the second region 2104. Moreover, sealant 24 surrounds the display medium layer 22 and the transparent layer 23 and covers the predetermined sealing region 234 of the transparent layer 23. Therefore, the external air or mist may be prevented from permeating into the display device 20. The materials of the sealant 24 may comprise at least one of silicone, epoxy resin and acryl. It should be noted that the preferred width of the predetermined sealing region 234 is about 2 mm, so the connecting area between the sealant 24 and the upper surface 230 of the transparent layer 23 may be increased without reducing the visible region of the display device 20.

Additionally, the display device 20 also comprises a driver IC 25 and a flexible circuit board 27 electrically connected to the external circuits (not shown). The driver IC 25 and the flexible circuit board 27 are disposed on the array substrate 21 and located in the second region 2104. In detail, the driver IC 25 is electrically connected with the switch elements array 214 of the array substrate 21 to drive the switch elements (not shown). The flexible circuit board 27 is used for electrically connecting the driver IC 25 to the external circuits. Thus, the driver IC may receive the commands outputted from the external circuits through the flexible circuit board 27. In this embodiment, the sealant 24 also covers the driver IC 25 and the flexible circuit board 27, as shown in FIG. 2.

For the display device 20, since the sealant 24 not only surrounds the display medium layer 22 and the transparent layer 23, but also covers the predetermined sealing region 234 of the transparent layer 23, so the contact area between the sealant 24 and the transparent layer 23 may be increased and the combination strength between the sealant 24 and other elements may be enhanced. Therefore, the fitness between the sealant 24 and the transparent layer 23 can be maintained after the display device 20 is bent for several times. Thus, the packaging reliability of the display device 20 may be increased.

Figure 3A:
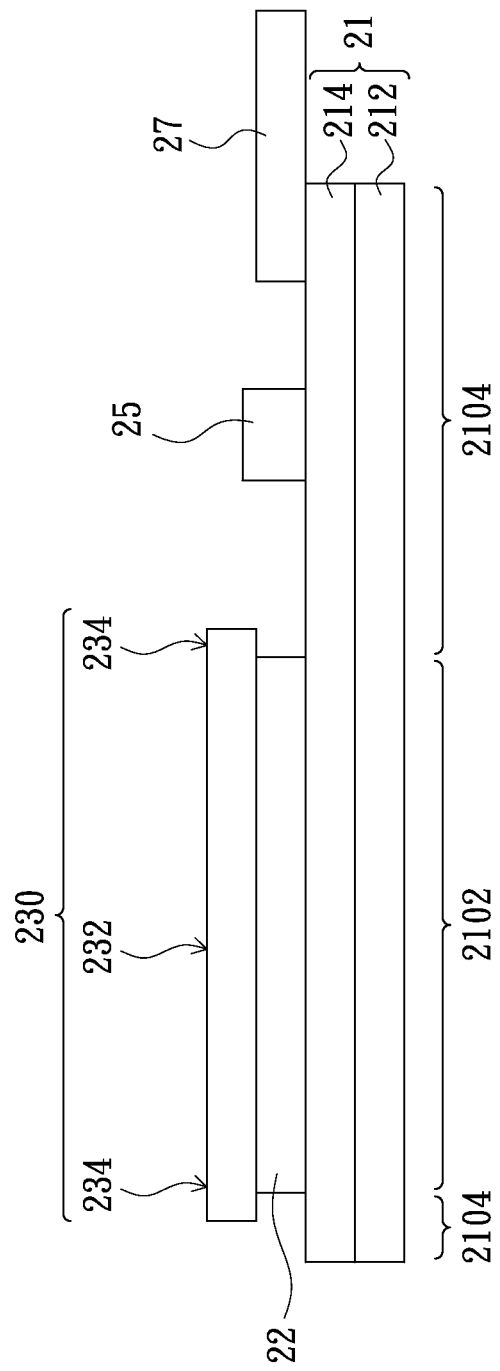
FIG. 3A to FIG. 3D are schematic cross-sectional views of the display device during the fabricating process thereof according to an embodiment of the invention.

Some embodiments with accompanying drawings are cited in the following to demonstrate the method for fabricating the display device of the invention. FIG. 3A to FIG. 3D are schematic cross-sectional views of the display device during the fabricating process thereof according to an embodiment of the invention. Referring to FIG. 3A, an array substrate 21 with a first region 2102 and a second region 2104 surrounding the first region 2102 are provided first. As the aforementioned, the array substrate 21 may comprise a substrate 212 and a switch elements array 214 disposed thereon.

Next, a display medium layer 22 and a transparent layer 23 are formed in sequence in the first region 2102 of the array substrate 21. The transparent layer 23 has an upper surface 230 with a display region 232 and a predetermined sealing region 234 surrounding the display region 232. Specially, the width D of the predetermined sealing region 234 of the transparent layer 23 is, for example, 2 mm. Besides, a driver IC 25 used for driving the switch elements array 214 and a flexible circuit board 27 electrically connected to external circuits are disposed in the second region 2104 of the array substrate 21 after forming the transparent layer 23.

Then, a sealant 24 is formed in the second region 2104 of the array substrate 21 to surround the transparent layer 23 and the display medium layer 22 and cover the predetermined sealing region 234 of the transparent layer, as shown in FIG. 2. In detail, the sealant 24 is formed by coating a seal material and curing the seal material. The seal material, such as at least one of silicone, epoxy resin and acryl, is coated in the second region 2104 of the array substrate 21 to surround the transparent layer 23 and the display medium layer 22 and cover the predetermined sealing region 234 of the transparent layer 23. The method of curing the seal material is selected according to the material of the seal material. For example, it may be photo-curing or heat-curing.

Figure 3B:
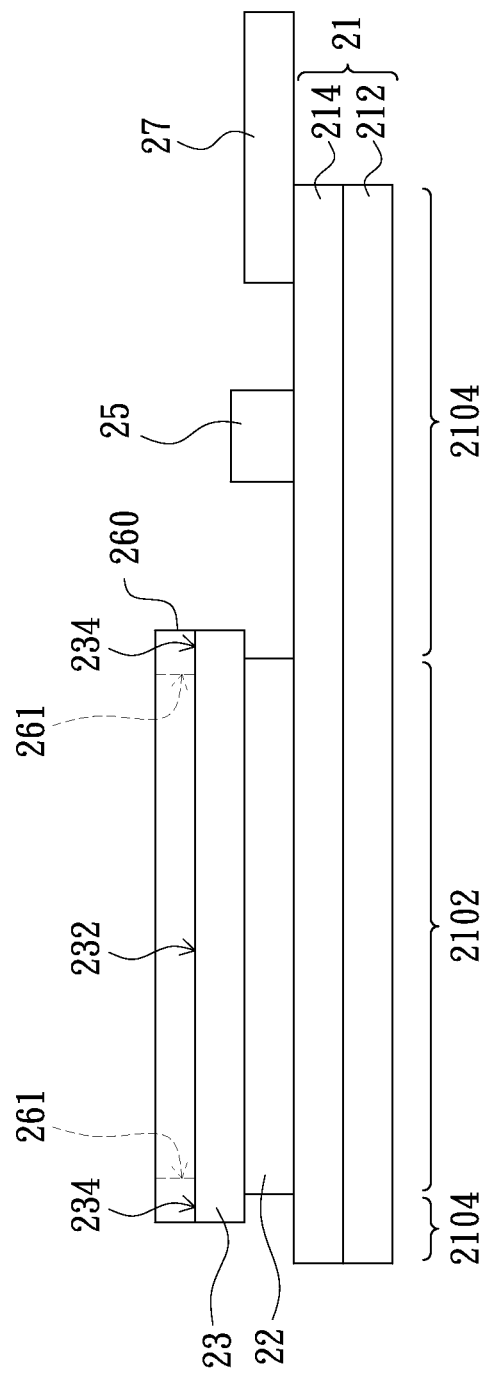
Figure 3C:
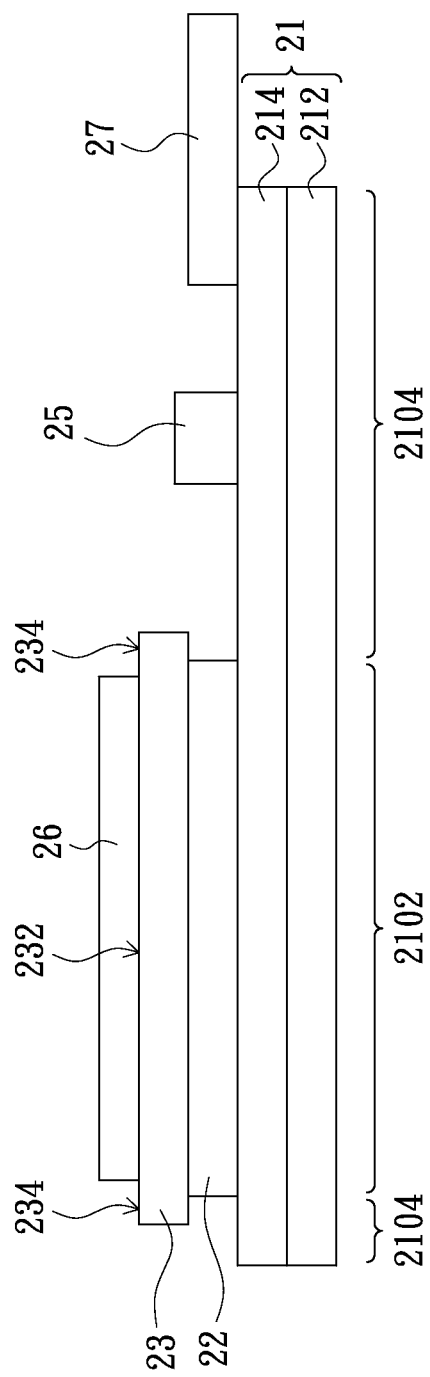
Figure 3D:
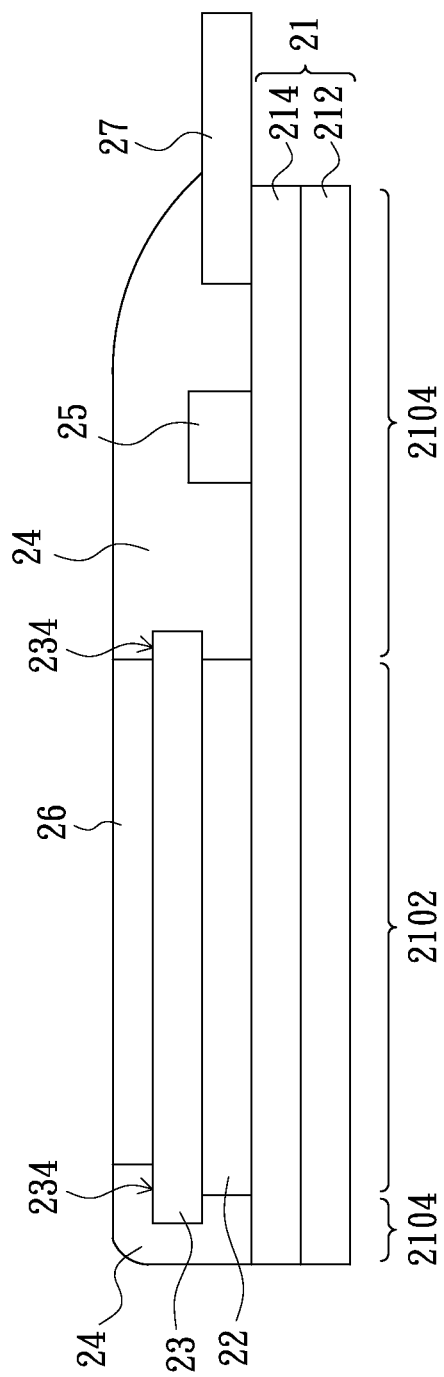

Referring to FIG. 3B to FIG. 3C, before coating the seal material, a release film 26 is formed in the display region 232 of the transparent layer 23 for preventing the seal material from covering the display region 232 of the transparent layer 23. Therefore, the process yield of the display device 20 may be increased. Specifically, an original release film 260 is adhered on the upper surface 230 of the transparent layer 23 first, as shown in FIG. 3B. Then, a portion of the original release film 260 corresponding to the predetermined sealing region 234 of the transparent layer 23 is removed along the pre-cutting line 261 locating at boundary between the display region 232 and the predetermined sealing region 234 of the transparent layer 23 to form the release film 26, as shown in FIG. 3C. Consequently, the seal material may cover the predetermined sealing region 234 of the transparent layer 23 during the coating process thereof. Then, the seal material is cured to form the sealant 24, as shown in FIG. 3D.

Specially, the release film 26 is removed from the transparent layer 23 after forming the sealant 24 to fabricate the display device 20 shown in FIG. 2, so the improved display performance of the display device 20 may be assured.

It should be noted that although in the aforementioned embodiment, the release film 260 is adhered on the upper surface 230 of the transparent layer 23 after disposing the transparent layer 23 on the display medium layer 22, but the invention is not limited hereto. In other embodiments, the release film 260 may be adhered on the upper surface 230 of the transparent layer 23 before disposing the transparent layer 23 on the display medium layer 22. Those skilled in the art may select the easier method for adhering the release film according to the material and the rigidness of the transparent layer 23.

In summary, for the display device of the invention, since the sealant not only surrounds the display medium layer and the transparent layer, also covers the predetermined sealing region of the transparent layer to increase the contact area between the sealant and the transparent layer, the combination strength between the sealant and other elements may be enhanced. Thus, it may prevent the sealant from resulting slits after the display device is bent for several times. Therefore, the invention may effectively increase the packaging reliability of display device.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A display device, comprising:
an array substrate structure having a first region and a second region surrounding the first region;
a display medium layer disposed on the array substrate structure and in the first region;
a transparent layer disposed on the display medium layer, wherein the transparent layer has a side surface, a lower surface and an opposite upper surface, the upper surface has a display region and a predetermined sealing region surrounding the display region, the side surface is connected between the upper surface and the lower surface, and the lower surface is interposed between the upper surface and the display medium layer; and
a sealant formed in the second region of the array substrate structure, surrounding the transparent layer and the display medium layer and covering the predetermined sealing region of the transparent layer, wherein the sealant is in contact with the upper surface and the side surface.

2. The display device as recited in claim 1, the array substrate structure comprising:
a substrate layer; and
a switch elements array disposed on the substrate layer.

3. The display device as recited in claim 2, wherein the substrate layer is a flexible substrate layer.

4. The display device as recited in claim 2, wherein the switch elements array is an active elements array or a passive elements array.

5. The display device as recited in claim 4, wherein the switch elements array is a thin film transistors array.

6. The display device as recited in claim 1, wherein the display medium layer is an electro-phoretic layer, an electro-wetting layer or an organic luminescence layer, and the transparent layer is a protective layer.

7. The display device as recited in claim 1, wherein the display medium layer is a liquid crystal layer and the transparent layer is a polarizer.

8. The display device as recited in claim 1, wherein the materials of the sealant comprise at least one of silicone, epoxy resin and acryl.

9. The display device as recited in claim 1, wherein the width of the predetermined sealing region is larger than or equal to 2 mm.

10. A method for fabricating display device, comprising the steps of:
providing an array substrate structure having a first region and a second region surrounding the first region;
forming a display medium layer and a transparent layer in sequence in the first region of the array substrate structure, wherein the transparent layer has a side surface, a lower surface and an opposite upper surface with a display region and a predetermined sealing region surrounding the display region, the side surface is connected between the upper surface and the lower surface, and the lower surface is interposed between the upper surface and the display medium layer; and
forming a sealant in the second region of the array substrate structure, wherein the transparent layer and the display medium layer are surrounded and the predetermined sealing region of the transparent layer is covered by the sealant, wherein the sealant is in contact with the upper surface and the side surface.

11. The method as recited in claim 10, further comprising a step of forming a release film on the display region of the transparent layer before forming the sealant.

12. The method as recited in claim 11, further comprising a step of removing the release film after forming the sealant.

13. The method as recited in claim 11, where the step of forming the release film on the display region of the transparent layer comprising:
adhering an original release film with a pre-cutting line on the upper surface of the transparent layer; and
removing a portion of the original release film corresponding to the predetermined sealing region along the pre-cutting line to obtain the release film.

14. The method as recited in claim 10, wherein the step of forming the sealant comprising:
coating a seal material in the second region of the array substrate structure for surrounding the transparent layer and the display medium layer and covering the predetermined sealing region of the transparent layer; and
curing the seal material to the sealant.

15. The method as recited in claim 14, wherein the seal material comprises at least one of silicone, epoxy resin and acryl.

16. The method as recited in claim 14, wherein the method of curing the seal material is photo-curing or heat-curing.

17. The method as recited in claim 10, wherein the width of the predetermined sealing region is larger than or equal to 2 mm.

18. The display device as recited in claim 1, wherein the sealant receives an edge of the transparent layer therein.

19. The method as recited in claim 10, wherein the sealant is formed to receive an edge of the transparent layer therein.

* * * * *